United States Patent
Matsuta et al.

(10) Patent No.: US 6,922,119 B2
(45) Date of Patent: Jul. 26, 2005

(54) SURFACE ACOUSTIC WAVE FILTER ADAPTED TO RESTRAIN UNDUE TEMPERATURE RISE

(75) Inventors: Shigetoshi Matsuta, Fukushima-ken (JP); Shoji Kai, Fukushima-ken (JP); Hideki Kondo, Fukushima-ken (JP); Akihiko Inoue, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 116 days.

(21) Appl. No.: 10/338,459

(22) Filed: Jan. 7, 2003

(65) Prior Publication Data

US 2003/0132517 A1 Jul. 17, 2003

(30) Foreign Application Priority Data

Jan. 9, 2002 (JP) ........................................ 2002-002500

(51) Int. Cl.⁷ ............................ H03H 9/64; H03H 9/10
(52) U.S. Cl. ..................... 333/193; 310/313 R; 310/346
(58) Field of Search ................................. 333/193–196, 333/133; 310/313 R, 346

(56) References Cited

U.S. PATENT DOCUMENTS

| | | | |
|---|---|---|---|
| 5,786,738 A | | 7/1998 | Ikata et al. .................. 333/133 |
| 6,310,422 B1 | * | 10/2001 | Satoh et al. ............. 310/313 R |
| 6,351,194 B2 | * | 2/2002 | Takahashi et al. .......... 333/133 |
| 2002/0000089 A1 | | 1/2002 | Takahashi et al. .......... 333/133 |
| 2002/0000895 A1 | | 1/2002 | Takahashi et al. .......... 333/133 |

FOREIGN PATENT DOCUMENTS

| | | | |
|---|---|---|---|
| JP | H06-029779 | | 2/1994 |
| JP | 8-307196 | * | 11/1996 |
| JP | 11-26623 | * | 1/1999 |
| JP | 2000-196407 | * | 7/2000 |

OTHER PUBLICATIONS

Search Report dated Aug. 16, 2004 for European Patent Application No, 03 25 0066.
Search Report dated Aug. 16, 2004 for European Patent Application No. 03 25 0066.

* cited by examiner

Primary Examiner—Barbara Summons
(74) Attorney, Agent, or Firm—Brinks Hofer Gilson & Lione

(57) ABSTRACT

A surface acoustic wave (SAW) filter includes a SAW chip mounted in a recession of a multi-layer substrate, a sealing plate covering the recession, an end surface electrode that is provided on the outer surface of the substrate and is in conduction with the SAW chip, a metal conductor for radiating heat that is provided on the surface at the opposite side from the sealing plate of the multi-layer substrate, and a through hole provided in the substrate, one end thereof being connected to the metal conductor. The other end of the through hole is connected with the SAW chip through the intermediary of a metal constituent, such as an electrically conductive adhesive layer.

3 Claims, 2 Drawing Sheets

SURFACE ACOUSTIC WAVE FILTER ADAPTED TO RESTRAIN UNDUE TEMPERATURE RISE

This application claims the benefit of priority to Japanese Application 2002-002500, filed on Jan. 9, 2002.

BACKGROUND OF THE INVENTION

1. Field of the Invention

The present invention relates to a surface mount type surface acoustic wave (hereinafter referred to as "SAW") filter incorporating a SAW chip, which is an electronic component making use of SAW on a piezoelectric substrate and, more particularly, to their measures for radiating heat.

2. Description of the Related Art

In recent years, SAW filters for selectively passing signals of particular frequencies therethrough are in extensive use as transmitting filters or receiving filters in antenna switching circuits or the like for transmitting and receiving high-frequency signals.

FIG. 3 is a sectional view illustrating a conventional construction of one of the aforesaid SAW filters. Referring to the figure, the conventional SAW filter is primarily constructed of a multi-layer substrate (LTCC) 1, a SAW chip 2 mounted in a recession (i.e., a recess) 1a of the multi-layer substrate 1, an end surface electrode 3 extending from a side surface of the multi-layer substrate 1 toward a bottom surface thereof, and a sealing plate 4 formed of a metal plate or the like connected at a position appropriate to cover the recession 1a of the multi-layer substrate 1. The multi-layer substrate 1 is composed of layered green sheets made of a low-temperature sintered ceramic material and fired at 10000° C. or less. The multi-layer substrate 1 is mounted on a motherboard (not shown). The SAW chip 2 is formed of a piezoelectric substrate made of crystal or the like, a predetermined electrode pattern being formed on the surface thereof. The SAW chip 2 is connected to a lead pattern 6 by a bonding wire 5. The lead pattern 6 is in conduction with the end surface electrode 3, so that the SAW chip 2 can be electrically connected to an external circuit through the intermediary of the end surface electrode 3. The bottom surface of the SAW chip 2 is adhesively secured to the inner bottom surface of the recession 1a of the multi-layer substrate 1, and the recession 1a is filled with an inert gas, such as nitrogen.

When a SAW filter is used as a transmitting filter for an antenna switching circuit, a transmitter signal amplified by a power amplifier is supplied to the SAW filter. Hence, the heat generated by the SAW chip 2 shown in FIG. 3 cannot be ignored. More specifically, when an amplified transmitter signal is received, the SAW chip 2 generates considerable Joule heat; therefore, if transmission is continued for a prolonged time, the mere heat radiation primarily depending upon the sealing plate 4 can no longer sufficiently restrain a temperature rise in the SAW chip 2. For this reason, the conventional SAW filters used as transmitting filters have been posing a problem in that an undue temperature rise attributable to the heat generated by themselves adversely affects the characteristics of the SAW chip 2, making it difficult to achieve high reliability thereof.

SUMMARY OF THE INVENTION

The present invention has been made with a view toward solving the problems with the prior art described above, and it is an object of the invention to provide a highly reliable SAW filter capable of restraining an undue temperature rise attributable to the heat generated by a SAW chip.

To this end, the present invention provides a SAW filter having a substrate that has a recession and is mounted on a motherboard, a SAW chip mounted in the recession of the substrate, an external electrode that is provided on an external surface, including side surfaces, of the substrate, and is in conduction with the SAW chip, a sealing plate connected to the substrate to cover the recession, a metal conductor for radiating heat that is provided on a surface of the substrate at the opposite side from the sealing plate, a through hole provided in the substrate, one end thereof being connected to the metal conductor, wherein the other end of the through hole is connected to the SAW chip through the intermediary of a metal constituent.

In the SAW filter schematically constructed as described above, the Joule heat generated in the SAW chip is conducted to the metal conductor via the through hole, allowing the metal conductor to function as a heat sink. For instance, if the SAW filter is mounted on a motherboard, the metal conductor side being the bottom surface, then the metal conductor is kept in contact with a conductor pattern (grounding pattern or the like) of the motherboard so as to dissipate heat through the intermediary of the conductor pattern. If the SAW filter is mounted on the motherboard, the sealing plate side being the bottom surface, then the heat is dissipated directly from the metal conductor to the surrounding space. Thus, even if the SAW chip generates a large amount of heat, the heat will be efficiently radiated through the metal conductor. This arrangement eliminates the possibility of an undue temperature rise in the SAW chip due to its own generated heat, permitting stable performance to be always maintained.

Preferably, an adhesive layer formed of an electrically conductive adhesive agent is provided on the inner bottom surface of the recession of the substrate to secure the SAW chip to the substrate by the adhesive layer, and the other end of the through hole is connected to the adhesive layer. With this arrangement, the Joule heat generated in the SAW chip is promptly transferred to the electrically conductive adhesive layer, thus making it possible to achieve further efficient radiation of heat through the intermediary of the through hole and the metal conductor.

BRIEF DESCRIPTION OF THE DRAWINGS

FIG. 2 is a sectional view of a SAW filter according to a second embodiment of the present invention; and.

DESCRIPTION OF THE PREFERRED EMBODIMENTS

Figure 1:
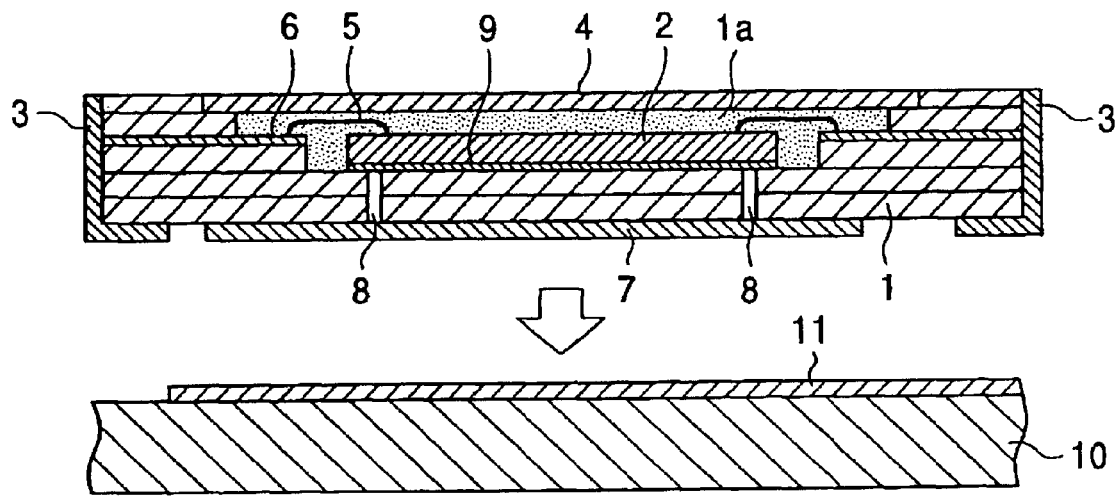
FIG. 1 is a sectional view of a SAW filter according to a first embodiment of the present invention.
Figure 3:
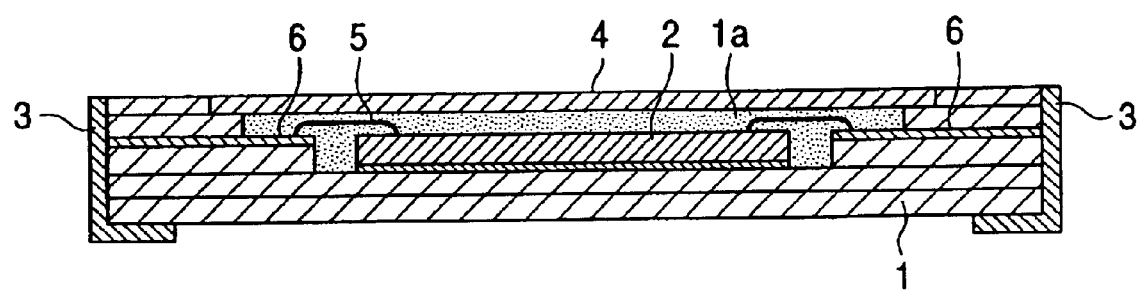
FIG. 3 is a sectional view of a SAW filter according to a conventional example.

Embodiments in accordance with the present invention will be explained with reference to the accompanying drawings. FIG. 1 is a sectional view of a SAW filter according to a first embodiment, in which the components corresponding to those shown in FIG. 3 are assigned the same reference numerals.

The SAW filter shown in FIG. 1 is constructed mainly of a multi-layer substrate 1 mounted on a motherboard 10, a SAW chip 2 mounted in a recession 1a of the multi-layer substrate 1, an end surface electrode 3 extending from a side surface to a bottom surface of the multi-layer substrate 1, a sealing plate 4 formed of a metal plate or the like that is connected to the upper surface of the multi-layer substrate 1 to cover the recession 1a, a metal conductor 7 provided on the bottom surface of the multi-layer substrate 1, and through holes 8 provided at a plurality of locations between the bottom surface of the SAW chip 2 and the metal conductor 7.

The multi-layer substrate 1 is composed of layered green sheets made of a low-temperature sintered ceramic material and fired at 1000° C. or less. The inner bottom surface of the recession 1a of the multi-layer substrate 1 is provided with an adhesive layer 9 formed of an electrically conductive adhesive agent. The electrically conductive adhesive layer 9 combines a function for securing the SAW chip 2 in the recession 1a and a function for transmitting the Joule heat generated in the SAW chip 2 to the through holes 8. More specifically, both upper and lower ends of the through holes 8 are connected to the adhesive layer 9 and the metal conductor 7, respectively. Hence, the Joule heat generated in the SAW chip 2 is transmitted from the through holes 8 to the metal conductor 7 through the intermediary of the adhesive layer 9. The recession 1a is filled with an inert gas, such as nitrogen.

The SAW chip 2 is formed of a piezoelectric substrate made of crystal or the like, a predetermined electrode pattern being formed on the surface thereof. The SAW chip 2 is in conduction with an end surface electrode 3 through the intermediary of a bonding wire 5 and a lead pattern 6. Hence, mounting the SAW filter on the motherboard 10 and soldering the end surface electrode 3 to a solder land (not shown) of an external circuit will electrically connect the SAW chip 2 to the external circuit through the intermediary of the end surface electrode 3.

The SAW filter having the construction discussed above is mounted on the motherboard 10, its metal conductor 7 side being the bottom surface, and the metal conductor 7 of the SAW filter is maintained in surface contact with a grounding pattern 11 formed on the motherboard 10 in advance. This arrangement causes the Joule heat generated in the SAW chip 2 to be transferred to the grounding pattern 11 of the motherboard 10 through the intermediary of the electrically conductive adhesive layer 9, the through holes 8, and the metal conductor 7 so as to be efficiently dissipated through the grounding pattern 11 having a large surface area. Therefore, even under a service condition in which the SAW chip 2 produces a relatively large amount of heat, as in the case where the SAW filter is used as a transmission filter of an antenna switching circuit, the heat is efficiently dissipated by making use of the grounding pattern 11 of the motherboard 10. This obviates the possibility of an undue temperature rise in the SAW chip 2 due to its own generated heat, permitting stable performance to be always maintained.

Figure 2:
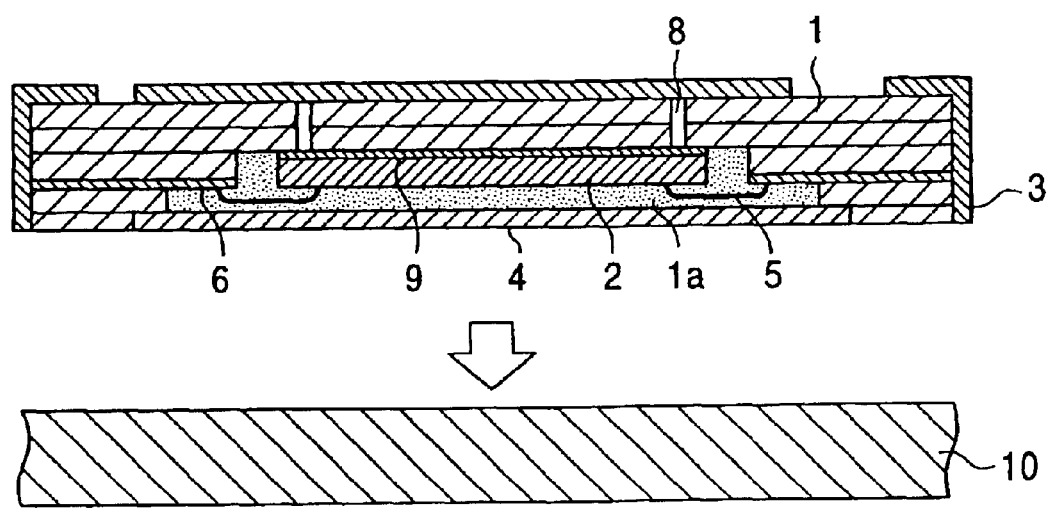

FIG. 2 is a sectional view of a SAW filter according to a second embodiment, wherein the components corresponding to those shown in FIG. 1 are assigned the same reference numerals.

This embodiment differs from the first embodiment in that the SAW filter is mounted on a motherboard 10 with its sealing plate side 4 as the bottom surface, the rest of the construction of this embodiment being basically the same. When the SAW filter is mounted on the motherboard 10, the sealing plate 4 side being the bottom surface, a metal conductor 7 is maintained exposed to outer space. This arrangement allows the Joule heat generated in the SAW chip 2 to be efficiently radiated to the surrounding space through the intermediary of the metal conductor 7.

Thus, the present invention provides an advantage in that the Joule heat produced in a SAW chip is transmitted to a metal conductor via through holes, allowing the metal conductor to function as a heat sink capable of achieving efficient heat radiation. This makes it possible to provide a high-reliability SAW filter capable of restraining an undue temperature rise due to the heat generated in the SAW chip.

What is claimed is:

1. A SAW filter comprising:

a substrate that has a recess;

a SAW chip mounted in the recess of the substrate;

an external electrode that is provided on an external surface, including side surfaces, of the substrate, and is in conduction with the SAW chip;

a sealing plate connected to the substrate to cover the recess;

a metal conductor for radiating heat that is provided on a surface of the substrate at an opposite side from the sealing plate; and a through hole provided in the substrate, the through hole being disposed between the SAW chip and the metal conductor, one end of the through hole being connected to the metal conductor, wherein the other end of the through hole is connected to the SAW chip through the intermediary of a metal constituent.

2. The SAW filter according to claim 1, wherein an adhesive layer formed of an electrically conductive adhesive agent is provided on an inner bottom surface of the recess of the substrate so as to secure the SAW chip onto the substrate by the adhesive layer, and the other end of the through hole is connected to the adhesive layer.

3. The SAW filter according to claim 1, wherein the SAW filter is mounted on a motherboard.

* * * * *